US007003410B2

(12) United States Patent
Bertness et al.

(10) Patent No.: US 7,003,410 B2
(45) Date of Patent: Feb. 21, 2006

(54) ELECTRONIC BATTERY TESTER WITH RELATIVE TEST OUTPUT

(75) Inventors: Kevin I. Bertness, Batavia, IL (US); J. David Vonderhaar, Bolingbrook, IL (US)

(73) Assignee: Midtronics, Inc., Willowbrook, IL (US)

( * ) Notice: Subject to any disclaimer, the term of this patent is extended or adjusted under 35 U.S.C. 154(b) by 36 days.

(21) Appl. No.: 10/870,680

(22) Filed: Jun. 17, 2004

(65) Prior Publication Data

US 2005/0021475 A1 Jan. 27, 2005

Related U.S. Application Data

(60) Continuation-in-part of application No. 10/263,473, filed on Oct. 2, 2002, now abandoned, application No. 10/870,680, and a continuation-in-part of application No. 10/656,538, filed on Sep. 5, 2003, now Pat. No. 6,914,413, which is a continuation-in-part of application No. 10/098,741, filed on Mar. 14, 2002, now Pat. No. 6,885,195, which is a continuation-in-part of application No. 09/575,629, filed on May 22, 2000, now Pat. No. 6,445,158, which is a continuation-in-part of application No. 09/293,020, filed on Apr. 16, 1999, now Pat. No. 6,351,102, and a continuation-in-part of application No. 09/426,302, filed on Oct. 25, 1999, now Pat. No. 6,091,245, which is a division of application No. 08/681,730, filed on Jul. 29, 1996, now Pat. No. 6,051,976, application No. 10/870,680, and a continuation-in-part of application No. 10/791, 141, filed on Mar. 2, 2004, which is a continuation-in-part of application No. 10/098,741, filed on Mar. 14, 2002, now Pat. No. 6,885,195, which is a continuation-in-part of application No. 09/575,629, filed on May 22, 2000, now Pat. No. 6,445,158, which is a continuation-in-part of application No. 09/293,020, filed on Apr. 16, 1999, now Pat. No. 6,351,102, and a continuation-in-part of application No. 09/426,302, filed on Oct. 25, 1999, now Pat. No. 6,091,245, which is a division of application No. 08/681,730, filed on Jul. 29, 1996, now Pat. No. 6,051,976.

(60) Provisional application No. 60/330,441, filed on Oct. 17, 2001.

(51) Int. Cl.
*G01N 27/27* (2006.01)

(52) U.S. Cl. ........................ 702/63; 320/134; 320/136; 320/106

(58) Field of Classification Search ..................... None
See application file for complete search history.

(56) References Cited

U.S. PATENT DOCUMENTS 2,000,665 A 5/1935 Neal .......................... 439/440
2,514,745 A 7/1950 Dalzell ....................... 324/115

(Continued)

FOREIGN PATENT DOCUMENTS

DE 29 26 716 B1 1/1981

(Continued)

OTHER PUBLICATIONS

"Electrochemical Impedance Spectroscopy in Battery Development and Testing", *Batteries International,* Apr. 1997, pp. 59 and 62-63.

(Continued)

*Primary Examiner*—Carol S. W. Tsai
(74) *Attorney, Agent, or Firm*—Westman, Champlin & Kelly, P.A.

(57) ABSTRACT

An electronic battery tester for testing a storage battery determines a condition of the battery. The condition is a relative condition and is a function of a dynamic parameter of the battery and an empirical input variable.

67 Claims, 3 Drawing Sheets

U.S. PATENT DOCUMENTS

| | | | | | |
|---|---|---|---|---|---|
| 3,356,936 | A | | 12/1967 | Smith | 324/429 |
| 3,562,634 | A | | 2/1971 | Latner | 324/427 |
| 3,593,099 | A | | 7/1971 | Scholl | 320/127 |
| 3,607,673 | A | | 9/1971 | Seyl | 324/425 |
| 3,652,341 | A | | 3/1972 | Halsall et al. | 20/623.2 |
| 3,676,770 | A | | 7/1972 | Sharaf et al. | 324/430 |
| 3,729,989 | A | | 5/1973 | Little | 73/862.192 |
| 3,750,011 | A | * | 7/1973 | Kreps | 324/430 |
| 3,753,094 | A | | 8/1973 | Furuishi et al. | 324/430 |
| 3,796,124 | A | | 3/1974 | Crosa | 411/521 |
| 3,808,522 | A | | 4/1974 | Sharaf | 324/430 |
| 3,811,089 | A | | 5/1974 | Strezelewicz | 324/170 |
| 3,873,911 | A | | 3/1975 | Champlin | 324/430 |
| 3,876,931 | A | | 4/1975 | Godshalk | 324/429 |
| 3,886,443 | A | | 5/1975 | Miyakawa et al. | 324/426 |
| 3,889,248 | A | | 6/1975 | Ritter | 340/636 |
| 3,906,329 | A | | 9/1975 | Bader | 320/134 |
| 3,909,708 | A | | 9/1975 | Champlin | 324/431 |
| 3,936,744 | A | | 2/1976 | Perlmutter | 324/772 |
| 3,946,299 | A | | 3/1976 | Christianson et al. | 320/430 |
| 3,947,757 | A | | 3/1976 | Grube et al. | 324/416 |
| 3,969,667 | A | | 7/1976 | McWilliams | 324/427 |
| 3,979,664 | A | | 9/1976 | Harris | 324/397 |
| 3,984,762 | A | | 10/1976 | Dowgiallo, Jr. | 324/430 |
| 3,984,768 | A | | 10/1976 | Staples | 324/712 |
| 3,989,544 | A | | 11/1976 | Santo | 429/65 |
| 4,008,619 | A | | 2/1977 | Alcaide et al. | 73/724 |
| 4,023,882 | A | | 5/1977 | Pettersson | 439/426 |
| 4,024,953 | A | | 5/1977 | Nailor, III | 206/344 |
| 4,047,091 | A | | 9/1977 | Hutchines et al. | 363/59 |
| 4,053,824 | A | | 10/1977 | Dupuis et al. | 324/434 |
| 4,056,764 | A | | 11/1977 | Endo et al. | 320/101 |
| 4,070,624 | A | | 1/1978 | Taylor | 324/772 |
| 4,086,531 | A | | 4/1978 | Bernier | 324/772 |
| 4,112,351 | A | | 9/1978 | Back et al. | 324/380 |
| 4,114,083 | A | | 9/1978 | Benham et al. | 320/150 |
| 4,126,874 | A | | 11/1978 | Suzuki et al. | 396/301 |
| 4,160,916 | A | | 7/1979 | Papasideris | 307/10.6 |
| 4,178,546 | A | | 12/1979 | Hulls et al. | 324/772 |
| 4,193,025 | A | * | 3/1980 | Frailing et al. | 324/427 |
| 4,207,611 | A | | 6/1980 | Gordon | 324/503 |
| 4,217,645 | A | | 8/1980 | Barry et al. | 702/63 |
| 4,280,457 | A | | 7/1981 | Bloxham | 123/198 |
| 4,297,639 | A | | 10/1981 | Branham | 324/429 |
| 4,315,204 | A | | 2/1982 | Sievers et al. | 322/28 |
| 4,316,185 | A | | 2/1982 | Watrous et al. | 320/116 |
| 4,322,685 | A | | 3/1982 | Frailing et al. | 324/429 |
| 4,351,405 | A | | 9/1982 | Fields et al. | 180/65.2 |
| 4,352,067 | A | | 9/1982 | Ottone | 324/434 |
| 4,360,780 | A | | 11/1982 | Skutch, Jr. | 324/437 |
| 4,361,809 | A | | 11/1982 | Bil et al. | 324/426 |
| 4,363,407 | A | | 12/1982 | Buckler et al. | 209/3.3 |
| 4,369,407 | A | | 1/1983 | Korbell | 324/416 |
| 4,379,989 | A | | 4/1983 | Kurz et al. | 320/165 |
| 4,379,990 | A | | 4/1983 | Sievers et al. | 322/99 |
| 4,385,269 | A | | 5/1983 | Aspinwall et al. | 320/129 |
| 4,390,828 | A | | 6/1983 | Converse et al. | 320/153 |
| 4,392,101 | A | | 7/1983 | Saar et al. | 320/156 |
| 4,396,880 | A | | 8/1983 | Windebank | 320/156 |
| 4,408,157 | A | | 10/1983 | Beaubien | 324/712 |
| 4,412,169 | A | | 10/1983 | Dell'Orto | 320/123 |
| 4,423,378 | A | | 12/1983 | Marino et al. | 324/427 |
| 4,423,379 | A | * | 12/1983 | Jacobs et al. | 324/429 |
| 4,424,491 | A | | 1/1984 | Bobbett et al. | 324/433 |
| 4,459,548 | A | | 7/1984 | Lentz et al. | 324/772 |
| 4,514,694 | A | | 4/1985 | Finger | 324/429 |
| 4,520,353 | A | | 5/1985 | McAuliffe | 340/636 |
| 4,564,798 | A | | 1/1986 | Young | 320/103 |
| 4,620,767 | A | | 11/1986 | Woolf | 439/217 |
| 4,633,418 | A | | 12/1986 | Bishop | 702/63 |
| 4,659,977 | A | | 4/1987 | Kissel et al. | 320/150 |
| 4,663,580 | A | | 5/1987 | Wortman | 320/153 |
| 4,665,370 | A | | 5/1987 | Holland | 324/429 |
| 4,667,143 | A | | 5/1987 | Cooper et al. | 320/153 |
| 4,667,279 | A | | 5/1987 | Maier | 363/46 |
| 4,678,998 | A | | 7/1987 | Muramatsu | 324/427 |
| 4,679,000 | A | | 7/1987 | Clark | 324/428 |
| 4,680,528 | A | | 7/1987 | Mikami et al. | 320/165 |
| 4,686,442 | A | | 8/1987 | Radomski | 320/123 |
| 4,697,134 | A | | 9/1987 | Burkum et al. | 320/134 |
| 4,707,795 | A | | 11/1987 | Alber et al. | 702/63 |
| 4,709,202 | A | | 11/1987 | Koenck et al. | 320/112 |
| 4,710,861 | A | | 12/1987 | Kanner | 363/46 |
| 4,719,428 | A | | 1/1988 | Liebermann | 324/436 |
| 4,723,656 | A | | 2/1988 | Kiernan et al. | 206/705 |
| 4,743,855 | A | | 5/1988 | Randin et al. | 324/430 |
| 4,745,349 | A | | 5/1988 | Palanisamy et al. | 320/125 |
| 4,816,768 | A | | 3/1989 | Champlin | 324/428 |
| 4,820,966 | A | | 4/1989 | Fridman | 320/116 |
| 4,825,170 | A | | 4/1989 | Champlin | 324/436 |
| 4,847,547 | A | | 7/1989 | Eng, Jr. et al. | 320/153 |
| 4,849,700 | A | | 7/1989 | Morioka et al. | 324/427 |
| 4,874,679 | A | | 10/1989 | Miyagawa | 429/91 |
| 4,876,495 | A | | 10/1989 | Palanisamy et al. | 320/106 |
| 4,881,038 | A | | 11/1989 | Champlin | 324/426 |
| 4,888,716 | A | | 12/1989 | Ueno | 702/63 |
| 4,912,416 | A | | 3/1990 | Champlin | 324/430 |
| 4,913,116 | A | | 4/1990 | Katogi et al. | 123/406.32 |
| 4,926,330 | A | | 5/1990 | Abe et al. | 364/424.03 |
| 4,929,931 | A | | 5/1990 | McCuen | 340/636 |
| 4,931,738 | A | | 6/1990 | MacIntyre et al. | 324/435 |
| 4,933,845 | A | | 6/1990 | Hayes | 710/104 |
| 4,934,957 | A | | 6/1990 | Bellusci | 439/504 |
| 4,937,528 | A | | 6/1990 | Palanisamy | 324/430 |
| 4,947,124 | A | | 8/1990 | Hauser | 324/430 |
| 4,949,046 | A | | 8/1990 | Seyfang | 324/427 |
| 4,956,597 | A | | 9/1990 | Heavey et al. | 320/129 |
| 4,968,941 | A | | 11/1990 | Rogers | 324/428 |
| 4,968,942 | A | | 11/1990 | Palanisamy | 324/430 |
| 5,004,979 | A | | 4/1991 | Marino et al. | 324/160 |
| 5,032,825 | A | | 7/1991 | Kuznicki | 340/636 |
| 5,037,778 | A | | 8/1991 | Stark et al. | 437/216 |
| 5,047,722 | A | | 9/1991 | Wurst et al. | 324/430 |
| 5,081,565 | A | | 1/1992 | Nabha et al. | 362/465 |
| 5,087,881 | A | | 2/1992 | Peacock | 324/378 |
| 5,095,223 | A | | 3/1992 | Thomas | 307/110 |
| 5,108,320 | A | | 4/1992 | Kimber | 439/883 |
| 5,126,675 | A | | 6/1992 | Yang | 324/435 |
| 5,140,269 | A | | 8/1992 | Champlin | 324/433 |
| 5,144,218 | A | | 9/1992 | Bosscha | 320/139 |
| 5,144,248 | A | | 9/1992 | Alexandres et al. | 324/428 |
| 5,159,272 | A | * | 10/1992 | Rao et al. | 324/429 |
| 5,160,881 | A | | 11/1992 | Schramm et al. | 322/7 |
| 5,170,124 | A | | 12/1992 | Blair et al. | 324/434 |
| 5,179,335 | A | | 1/1993 | Nor | 320/159 |
| 5,194,799 | A | | 3/1993 | Tomantschger | 320/103 |
| 5,204,611 | A | | 4/1993 | Nor et al. | 320/145 |
| 5,214,370 | A | | 5/1993 | Harm et al. | 320/152 |
| 5,214,385 | A | | 5/1993 | Gabriel et al. | 324/434 |
| 5,241,275 | A | | 8/1993 | Fang | 324/430 |
| 5,254,952 | A | | 10/1993 | Salley et al. | 324/429 |
| 5,266,880 | A | | 11/1993 | Newland | 320/125 |
| 5,281,919 | A | | 1/1994 | Palanisamy | 324/427 |
| 5,281,920 | A | | 1/1994 | Wurst | 324/430 |
| 5,295,078 | A | | 3/1994 | Stich et al. | 320/136 |
| 5,298,797 | A | | 3/1994 | Redl | 327/387 |
| 5,300,874 | A | | 4/1994 | Shimamoto et al. | 320/106 |
| 5,302,902 | A | | 4/1994 | Groehl | 324/434 |
| 5,313,152 | A | | 5/1994 | Wozniak et al. | 320/118 |
| 5,315,287 | A | | 5/1994 | Sol | 340/455 |
| 5,321,626 | A | | 6/1994 | Palladino | 702/63 |
| 5,321,627 | A | | 6/1994 | Reher | 364/483 |
| 5,323,337 | A | | 6/1994 | Wilson et al. | 364/574 |
| 5,325,041 | A | | 6/1994 | Briggs | 320/149 |

5,331,268 A 7/1994 Patino et al. ............... 320/158
5,336,993 A 8/1994 Thomas et al. .......... 324/158.1
5,338,515 A 8/1994 Dalla Betta et al. .......... 422/95
5,339,018 A 8/1994 Brokaw ..................... 320/147
5,343,380 A 8/1994 Champlin .................... 363/46
5,347,163 A 9/1994 Yoshimura .................. 307/66
5,352,968 A 10/1994 Reni et al. .................. 320/136
5,365,160 A 11/1994 Leppo et al. ............... 320/160
5,365,453 A 11/1994 Startup et al. ............. 320/136
5,369,364 A 11/1994 Renirie et al. .............. 324/430
5,381,096 A 1/1995 Hirzel ........................ 324/427
5,410,754 A 4/1995 Klotzbach et al. .......... 370/466
5,412,308 A 5/1995 Brown ....................... 323/267
5,412,323 A 5/1995 Kato et al. .................. 324/429
5,425,041 A * 6/1995 Seko et al. .................. 372/45
5,426,371 A 6/1995 Salley et al. ................ 324/429
5,426,416 A 6/1995 Jefferies et al. ............ 340/664
5,432,025 A 7/1995 Cox ........................... 429/65
5,432,426 A 7/1995 Yoshida ...................... 320/160
5,434,495 A 7/1995 Toko .......................... 320/135
5,435,185 A 7/1995 Eagan ........................ 73/587
5,442,274 A 8/1995 Tamai ........................ 320/146
5,445,026 A 8/1995 Eagan ........................ 73/591
5,449,996 A 9/1995 Matsumoto et al. ........ 320/148
5,449,997 A 9/1995 Gilmore et al. ............ 320/148
5,451,881 A 9/1995 Finger ....................... 324/433
5,453,027 A 9/1995 Buell et al. ................. 439/433
5,457,377 A 10/1995 Jonsson ............... 320/DIG. 21
5,469,043 A 11/1995 Cherng et al. .............. 320/161
5,485,090 A 1/1996 Stephens ................... 324/433
5,488,300 A 1/1996 Jamieson ................... 324/432
5,519,383 A 5/1996 De La Rosa ................ 340/636
5,528,148 A 6/1996 Rogers ...................... 320/137
5,537,967 A 7/1996 Tashiro et al. ........... 123/192.1
5,541,489 A 7/1996 Dunstan .................... 320/134
5,546,317 A 8/1996 Andrieu ...................... 702/63
5,548,273 A 8/1996 Nicol et al. ................. 340/439
5,550,485 A 8/1996 Falk .......................... 324/772
5,561,380 A 10/1996 Sway-Tin et al. ........... 324/509
5,562,501 A 10/1996 Kinoshita et al. ........... 439/852
5,563,496 A 10/1996 McClure .................... 320/128
5,572,136 A 11/1996 Champlin .................. 324/426
5,574,355 A 11/1996 McShane et al. ........... 320/161
5,578,915 A 11/1996 Crouch, Jr. et al. ......... 324/428
5,583,416 A 12/1996 Klang ........................ 320/160
5,585,728 A 12/1996 Champlin .................. 324/427
5,589,757 A * 12/1996 Klang ........................ 320/160
5,592,093 A 1/1997 Klingbiel .................... 324/426
5,592,094 A 1/1997 Ichikawa .................... 324/427
5,596,260 A 1/1997 Moravec et al. ............ 320/135
5,598,098 A 1/1997 Champlin .................. 324/430
5,602,462 A 2/1997 Stich et al. ................. 323/258
5,606,242 A 2/1997 Hull et al. .................. 320/106
5,614,788 A 3/1997 Mullins et al. .............. 315/82
5,621,298 A 4/1997 Harvey ...................... 320/134
5,633,985 A 5/1997 Severson et al. ........... 704/267
5,637,978 A 6/1997 Kellett et al. ............... 320/104
5,642,031 A 6/1997 Brotto ........................ 320/152
5,650,937 A 7/1997 Bounaga ........................ 702/6
5,652,501 A 7/1997 McClure et al. ............ 320/118
5,653,659 A 8/1997 Kunibe et al. .............. 477/111
5,654,623 A 8/1997 Shiga et al. ................ 320/106
5,656,920 A 8/1997 Cherng et al. .............. 320/161
5,661,368 A 8/1997 Deol et al. .................... 315/82
5,675,234 A 10/1997 Greene ................ 320/DIG. 18
5,677,077 A 10/1997 Faulk .......................... 429/90
5,699,050 A 12/1997 Kanazawa .................. 340/636
5,701,089 A 12/1997 Perkins ...................... 324/772
5,705,929 A 1/1998 Caravello et al. ........... 324/430
5,707,015 A 1/1998 Guthrie ...................... 241/120
5,710,503 A 1/1998 Sideris et al. ............... 320/116
5,711,648 A 1/1998 Hammerslag ............... 414/800
5,717,336 A 2/1998 Basell et al. ................ 324/430
5,717,937 A 2/1998 Fritz .......................... 320/128
5,739,667 A 4/1998 Matsuda et al. ............ 320/128
5,745,044 A 4/1998 Hyatt, Jr. et al. .......... 340/5.23
5,747,909 A 5/1998 Syverson et al. ...... 310/156.56
5,747,967 A 5/1998 Muljadi et al. ............. 320/148
5,754,417 A 5/1998 Nicollini ...................... 363/60
5,757,192 A 5/1998 McShane et al. ........... 324/427
5,760,587 A 6/1998 Harvey ....................... 324/434
5,772,468 A 6/1998 Kowalski et al. ........... 439/506
5,773,978 A 6/1998 Becker ....................... 324/430
5,780,974 A 7/1998 Pabla et al. ................... 315/82
5,780,980 A 7/1998 Naito ......................... 318/139
5,789,899 A 8/1998 van Phuoc et al. ......... 320/112
5,793,359 A 8/1998 Ushikubo .................. 345/169
5,796,239 A 8/1998 van Phuoc et al. ......... 320/107
5,808,469 A 9/1998 Kopera ...................... 324/434
5,818,234 A 10/1998 McKinnon ................. 324/433
5,821,756 A 10/1998 McShane et al. ........... 324/430
5,821,757 A 10/1998 Alvarez et al. ............. 324/434
5,825,174 A 10/1998 Parker ....................... 324/106
5,831,435 A 11/1998 Troy .......................... 324/426
5,850,113 A 12/1998 Weimer et al. ............. 307/125
5,862,515 A 1/1999 Kobayashi et al. ........... 702/63
5,865,638 A 2/1999 Trafton ...................... 439/288
5,872,443 A 2/1999 Williamson ................. 320/160
5,872,453 A 2/1999 Shimoyama et al. ....... 324/431
5,895,440 A 4/1999 Proctor et al. ................ 702/63
5,912,534 A 6/1999 Benedict ...................... 315/82
5,914,605 A 6/1999 Bertness ..................... 324/430
5,927,938 A 7/1999 Hammerslag ............... 414/809
5,929,609 A 7/1999 Joy et al. ...................... 322/25
5,939,855 A 8/1999 Proctor et al. .............. 320/104
5,939,861 A 8/1999 Joko et al. .................. 320/122
5,945,829 A 8/1999 Bertness ..................... 324/430
5,951,229 A 9/1999 Hammerslag ............... 414/398
5,961,561 A 10/1999 Wakefield, II ............... 701/29
5,961,604 A 10/1999 Anderson et al. ........... 709/229
5,969,625 A 10/1999 Russo ................... 340/636.19
5,978,805 A 11/1999 Carson ........................ 707/10
5,982,138 A 11/1999 Krieger ...................... 320/105
6,002,238 A 12/1999 Champlin .................. 320/134
6,005,759 A 12/1999 Hart et al. .................... 361/66
6,008,652 A 12/1999 Theofanopoulos et al. . 324/434
6,009,369 A 12/1999 Boisvert et al. .............. 701/99
6,016,047 A 1/2000 Notten et al. ............... 320/137
6,031,354 A 2/2000 Wiley et al. ................ 320/116
6,031,368 A 2/2000 Klippel et al. .............. 324/133
6,037,751 A 3/2000 Klang ........................ 320/160
6,037,777 A 3/2000 Champlin .................. 324/430
6,037,778 A 3/2000 Makhija ..................... 324/433
6,046,514 A 4/2000 Rouillard et al. ............. 307/77
6,051,976 A 4/2000 Bertness ..................... 324/426
6,055,468 A 4/2000 Kaman et al. ................ 701/29
6,061,638 A 5/2000 Joyce .......................... 702/63
6,064,372 A 5/2000 Kahkoska .................. 345/173
6,072,299 A 6/2000 Kurle et al. ................ 320/112
6,072,300 A 6/2000 Tsuji .......................... 320/116
6,081,098 A 6/2000 Bertness et al. ............ 320/134
6,081,109 A 6/2000 Seymour et al. ............ 324/127
6,091,238 A 7/2000 McDermott .............. 324/207.2
6,091,245 A * 7/2000 Bertness ..................... 324/426
6,094,033 A 7/2000 Ding et al. ................. 320/132
6,104,167 A 8/2000 Bertness et al. ............ 320/132
6,114,834 A 9/2000 Parise ........................ 320/109
6,137,269 A 10/2000 Champlin .................. 320/150
6,140,797 A 10/2000 Dunn ......................... 320/105
6,144,185 A * 11/2000 Dougherty et al. ......... 320/132
6,150,793 A 11/2000 Lesesky et al. ............. 320/104
6,158,000 A 12/2000 Collins .......................... 713/1
6,161,640 A 12/2000 Yamaguchi ................ 180/65.8
6,163,156 A * 12/2000 Bertness ..................... 324/426
6,167,349 A 12/2000 Alvarez ....................... 702/63
6,172,483 B1 1/2001 Champlin .................. 320/134

| | | | | |
|---|---|---|---|---|
| 6,172,505 | B1 | 1/2001 | Bertness | 324/430 |
| 6,181,545 | B1 | 1/2001 | Amatucci et al. | 361/502 |
| 6,211,651 | B1 | 4/2001 | Nemoto | 320/133 |
| 6,215,275 | B1 | 4/2001 | Bean | 320/106 |
| 6,222,342 | B1 | 4/2001 | Eggert et al. | 320/105 |
| 6,222,369 | B1 | 4/2001 | Champlin | 324/430 |
| D442,503 | S | 5/2001 | Lundbeck et al. | D10/77 |
| 6,225,808 | B1 | 5/2001 | Varghese et al. | 324/426 |
| 6,236,332 | B1 | 5/2001 | Conkright et al. | 340/3.1 |
| 6,238,253 | B1 | 5/2001 | Qualls | 439/759 |
| 6,242,887 | B1 | 6/2001 | Burke | 320/104 |
| 6,249,124 | B1 | 6/2001 | Bertness | 324/426 |
| 6,250,973 | B1 | 6/2001 | Lowery et al. | 439/763 |
| 6,254,438 | B1 | 7/2001 | Gaunt | 439/755 |
| 6,259,170 | B1 | 7/2001 | Limoge et al. | 307/10.8 |
| 6,259,254 | B1 | 7/2001 | Klang | 324/427 |
| 6,262,563 | B1 | 7/2001 | Champlin | 320/134 |
| 6,263,268 | B1 | 7/2001 | Nathanson | 701/29 |
| 6,275,008 | B1 | 8/2001 | Arai et al. | 320/132 |
| 6,294,896 | B1 | 9/2001 | Champlin | 320/134 |
| 6,294,897 | B1 | 9/2001 | Champlin | 320/153 |
| 6,304,087 | B1 | 10/2001 | Bertness | 324/426 |
| 6,307,349 | B1 | 10/2001 | Koenck et al. | 320/112 |
| 6,310,481 | B1 | 10/2001 | Bertness | 324/430 |
| 6,313,607 | B1 | 11/2001 | Champlin | 320/132 |
| 6,313,608 | B1 * | 11/2001 | Varghese et al. | 320/132 |
| 6,316,914 | B1 * | 11/2001 | Bertness | 320/134 |
| 6,323,650 | B1 | 11/2001 | Bertness et al. | 324/426 |
| 6,329,793 | B1 | 12/2001 | Bertness et al. | 320/132 |
| 6,331,762 | B1 | 12/2001 | Bertness | 320/134 |
| 6,332,113 | B1 | 12/2001 | Bertness | 702/63 |
| 6,346,795 | B1 | 2/2002 | Haraguchi et al. | 320/136 |
| 6,347,958 | B1 | 2/2002 | Tsai | 439/488 |
| 6,351,102 | B1 * | 2/2002 | Troy | 320/139 |
| 6,356,042 | B1 | 3/2002 | Kahlon et al. | 318/138 |
| 6,359,441 | B1 * | 3/2002 | Bertness | 324/426 |
| 6,359,442 | B1 | 3/2002 | Henningson et al. | 324/426 |
| 6,363,303 | B1 | 3/2002 | Bertness | 701/29 |
| RE37,677 | E | 4/2002 | Irie | 315/83 |
| 6,384,608 | B1 | 5/2002 | Namaky | 324/430 |
| 6,388,448 | B1 | 5/2002 | Cervas | 324/426 |
| 6,392,414 | B1 | 5/2002 | Bertness | 324/429 |
| 6,396,278 | B1 | 5/2002 | Makhija | 324/402 |
| 6,411,098 | B1 | 6/2002 | Laletin | 324/436 |
| 6,417,669 | B1 | 7/2002 | Champlin | 324/426 |
| 6,424,157 | B1 | 7/2002 | Gollomp et al. | 324/430 |
| 6,424,158 | B1 | 7/2002 | Klang | 324/433 |
| 6,441,585 | B1 | 8/2002 | Bertness | 320/132 |
| 6,445,158 | B1 | 9/2002 | Bertness et al. | 320/104 |
| 6,449,726 | B1 | 9/2002 | Smith | 713/340 |
| 6,456,045 | B1 | 9/2002 | Troy et al. | 320/139 |
| 6,466,025 | B1 | 10/2002 | Klang | 324/429 |
| 6,466,026 | B1 | 10/2002 | Champlin | 324/430 |
| 6,495,990 | B1 | 12/2002 | Champlin | 320/132 |
| 6,526,361 | B1 * | 2/2003 | Jones et al. | 702/63 |
| 6,531,848 | B1 | 3/2003 | Chitsazan et al. | 320/153 |
| 6,534,993 | B1 | 3/2003 | Bertness | 324/433 |
| 6,544,078 | B1 | 4/2003 | Palmisano et al. | 439/762 |
| 6,556,019 | B1 | 4/2003 | Bertness | 324/426 |
| 6,566,883 | B1 | 5/2003 | Vonderhaar et al. | 324/426 |
| 6,570,385 | B1 | 5/2003 | Roberts et al. | 324/378 |
| 6,586,941 | B1 | 7/2003 | Bertness et al. | 324/426 |
| 6,597,150 | B1 | 7/2003 | Bertness et al. | 320/104 |
| 6,600,815 | B1 | 7/2003 | Walding | 379/93.07 |
| 6,618,644 | B1 | 9/2003 | Bean | 700/231 |
| 6,628,011 | B1 | 9/2003 | Droppo et al. | 307/43 |
| 6,629,054 | B1 | 9/2003 | Makhija et al. | 702/113 |
| 6,667,624 | B1 * | 12/2003 | Raichle et al. | 324/522 |
| 6,679,212 | B1 | 1/2004 | Kelling | 123/179.28 |
| 6,777,945 | B1 | 8/2004 | Roberts et al. | 324/426 |
| 2002/0010558 | A1 | 1/2002 | Bertness et al. | 702/63 |
| 2002/0030495 | A1 | 3/2002 | Kechmire | 324/427 |
| 2002/0050163 | A1 | 5/2002 | Makhija et al. | 73/116 |
| 2002/0171428 | A1 | 11/2002 | Bertness | 324/426 |
| 2002/0176010 | A1 | 11/2002 | Wallach et al. | 348/362 |
| 2003/0025481 | A1 | 2/2003 | Bertness | 324/427 |
| 2003/0036909 | A1 | 2/2003 | Kato | 704/275 |
| 2003/0184262 | A1 | 10/2003 | Makhija | 320/130 |
| 2003/0184306 | A1 * | 10/2003 | Bertness et al. | 324/426 |
| 2003/0194672 | A1 | 10/2003 | Roberts et al. | 431/196 |
| 2004/0000590 | A1 | 1/2004 | Raichle et al. | 235/462.01 |
| 2004/0000891 | A1 * | 1/2004 | Raichle et al. | 320/107 |
| 2004/0000893 | A1 | 1/2004 | Raichle et al. | 320/135 |
| 2004/0000913 | A1 | 1/2004 | Raichle et al. | 324/426 |
| 2004/0000915 | A1 | 1/2004 | Raichle et al. | 324/522 |
| 2004/0002824 | A1 | 1/2004 | Raichle et al. | 702/63 |
| 2004/0002825 | A1 | 1/2004 | Raichle et al. | 702/63 |
| 2004/0002836 | A1 | 1/2004 | Raichle et al. | 702/188 |
| 2004/0049361 | A1 | 3/2004 | Hamdan et al. | 702/115 |
| 2004/0051533 | A1 | 3/2004 | Namaky | 324/426 |
| 2004/0054503 | A1 | 3/2004 | Namaky | 702/183 |

FOREIGN PATENT DOCUMENTS

| | | | | |
|---|---|---|---|---|
| EP | 0 022 450 | A1 | | 1/1981 |
| EP | 0 637 754 | A1 | | 2/1995 |
| EP | 0 772 056 | A1 | | 5/1997 |
| FR | 2 749 397 | | | 12/1997 |
| GB | 2 088 159 | A | | 6/1982 |
| GB | 2 246 916 | A | | 10/1990 |
| GB | 2 387 235 | A | | 10/2003 |
| JP | 5-17894 | | | 1/1984 |
| JP | 59-17892 | | | 1/1984 |
| JP | 59-17893 | | | 1/1984 |
| JP | 59017894 | | | 1/1984 |
| JP | 59215674 | | | 12/1984 |
| JP | 60225078 | | | 11/1985 |
| JP | 62-180284 | | | 8/1987 |
| JP | 63027776 | | | 2/1988 |
| JP | 03274479 | | | 12/1991 |
| JP | 03282276 | | | 12/1991 |
| JP | 4-8636 | | | 1/1992 |
| JP | 04095788 | | | 3/1992 |
| JP | 04131779 | | | 5/1992 |
| JP | 04372536 | | | 12/1992 |
| JP | 5216550 | | | 8/1993 |
| JP | 7-128414 | | | 5/1995 |
| JP | 09061505 | | | 3/1997 |
| JP | 10056744 | | | 2/1998 |
| JP | 10232273 | | | 9/1998 |
| JP | 11103503 | A | * | 4/1999 |
| RU | 2089015 | C1 | | 8/1997 |
| WO | WO 93/22666 | | | 11/1993 |
| WO | WO 94/05069 | | | 3/1994 |
| WO | WO 97/44652 | | | 11/1997 |
| WO | WO 98/04910 | | | 2/1998 |
| WO | WO 98/58270 | | | 12/1998 |
| WO | WO 99/23738 | | | 5/1999 |
| WO | WO 00/16083 | | | 3/2000 |
| WO | WO 00/62049 | | | 10/2000 |
| WO | WO 00/67359 | | | 11/2000 |
| WO | WO 01/59443 | | | 2/2001 |
| WO | WO 00/16614 | A1 | | 3/2001 |
| WO | WO 00/16615 | A1 | | 3/2001 |
| WO | WO 01/51947 | | | 7/2001 |

OTHER PUBLICATIONS

"Battery Impedance", by E. Willihnganz et al., *Electrical Engineering,* Sep. 1959, pp. 922-925.

"Determining The End of Battery Life", by S. DeBardelaben, *IEEE,* 1986, pp. 365-368.

"A Look at the Impedance of a Cell", by S. Debardelaben, *IEEE,* 1988, pp. 394-397.

"Impedance of Electrical Storage Cells", by N.A. Hampson et al., *Journal of Applied Electrochemistry,* 1980, pp. 3-11.

"A Package for Impedance/Admittance Data Analysis", by B. Boukamp, *Solid State Ionics,* 1986, pp. 136-140.
"Precision of Impedance Spectroscopy Estimates of Bulk, Reaction Rate, and Diffusion Parameters", by J. Macdonald et al., *J. Electroanal, Chem.,* 1991, pp. 1-11.
Internal Resistance: Harbinger of Capacity Loss in Starved Electrolyte Sealed Lead Acid Batteries, by Vaccaro, F.J. et al., *AT&T Bell Laboratories,* 1987 IEEE, Ch. 2477, pp. 128,131.
IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE,* Aug. 1992, pp. 218-233.
"JIS Japanese Industrial Standard-Lead Acid Batteries for Automobiles", *Japanese Standards Association UDC,* 621. 355.2:629.113.006, Nov. 1995.
"Performance of Dry Cells", by C. Hambuechen, Preprint of *Am. Electrochem. Soc.,* Apr. 18-20, 1912, paper No. 19, pp. 1-5.
"A Bridge for Measuring Storage Battery Resistance", by E. Willihncanz, *The Electrochemical Society,* preprint 79-20, Apr. 1941, pp. 253-258.
National Semiconductor Corporation, "High Q Notch Filter", Linear Brief 5, Mar. 1969.
Burr-Brown Corporation, "Design A 60 Hz Notch Filter with the UAF42", Jan. 1994, AB-071.
National Semiconductor Corporation, "LMF90-4$^{th}$-Order Elliptic Notch Filter", RRD-B30M115, Dec. 1994.
"Alligator Clips with Wire Penetrators" *J.S. Popper, Inc.* product information, downloaded from http://www.jspopper.com/, undated.
"#12: LM78S40 Simple Switcher DC to DC Converter", *ITM e-Catalog,* downloaded from http://www.pcbcafe.com, undated.
"Simple DC-DC Converts Allows Use of Single Battery", *Electronix Express,* downloaded from http://www.elexp.com/t_dc-dc.htm, undated.
"DC-DC Converter Basics", *Power Designers,* downloaded from http://www.powederdesigners.com/InforWeb.design_center/articles/DC-DC/converter.shtm, undated.
"Notification of Transmittal of The International Search Report or the Declaration", PCT/US02/29641.
"Notification of Transmittal of The International Search Report or the Declaration", PCT/US03/07546.
"Notification of Transmittal of The International Search Report of the Declaration", PCT/US03/41561.
"Notification of Transmittal of The International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1—14-13, (1991).
"Professional BCS System Analyzer, Batter-Charging-Starting" Catalog, 8 pages (2001).
"Dynamic modelling of lead/acid batteries using impedance spectroscopy for parameter identification", Journal of Power Sources, pp. 69-84, (1997).
"A review of impedance measurements for determination of the state-of-charge or state-of-health of secondary batteries", Journal of Power Sources, pp. 59-69, (1998).
"Improved Impedance Spectroscopy Technique For Status Determination of Production Li/$SO_2$ Batteries" Terrill Atwater et al., pp. 10-113, (1992).
"Search Report Under Section 17" for Great Britain Application No. GB0421447.4. (Jan. 28, 2005).
"Results of Discrete Frequency Immittance Spectroscopy (DFIS) Measurements of Lead Acid Batteries", by K.S. Champlin et al., *Proceedings of 23$^{rd}$ International Teleco Conference* (*INTELEC*), published Oct. 2001, IEE, pp. 433-440.
"Examination Report" from the U.K. Patent Office for U.K. App. No. 0417678.0.

* cited by examiner

ELECTRONIC BATTERY TESTER WITH RELATIVE TEST OUTPUT

The present application is a Continuation of U.S. application Ser. No. 10/263,473, filed Oct. 2, 2002 now abandoned, which is based on and claims the benefit of U.S. provisional patent application Ser. No. 60/330,441, filed Oct. 17, 2001; the present application is also a Continuation-In-Part of U.S. application Ser. No. 10/656,538, filed Sep. 5, 2003 now U.S. Pat. No. 6,914,413, which is a Continuation-In-Part of Ser. No. 10/098,741, filed Mar. 14, 2002, which is a continuation-in-part of U.S. patent application Ser. No. 09/575,629, filed May 22, 2000 now U.S. Pat. No. 6,445,158, which is a Continuation-In-Part of Ser. No. 09/293,020, filed Apr. 16, 1999, now U.S. Pat. No. 6,351,102; application Ser. No. 09/575,629 is also a Continuation-In-Part of Ser. No. 09/426,302, filed Oct. 25, 1999, now U.S. Pat. No. 6,091,245; which is a Divisional of Ser. No. 08/681,730, filed Jul. 29, 1996, now U.S. Pat. No. 6,051,976, the present application is also a Continuation-In-Part of U.S. Ser. No. 10/791,141, filed Mar. 2, 2004, which is a Continuation-In-Part of U.S. Ser. No. 10/098,741, filed Mar. 14, 2002, which is a continuation-in-part of U.S. patent application Ser. No. 09/575,629, filed May 22, 2000, which is a Continuation-In-Part of Ser. No. 09/293,020, filed Apr. 16, 1999, now U.S. Pat. No. 6,351,102; application Ser. No. 09/575,629 is also a Continuation-In-Part of Ser. No. 09/426,302, filed Oct. 25, 1999, now U.S. Pat. No. 6,091,245; which is a Divisional of Ser. No. 08/681,730, filed Jul. 29, 1996, now U.S. Pat. No. 6,051,976, the content of which is hereby incorporated by reference in its entirety.

BACKGROUND OF THE INVENTION

The present invention relates to measuring the condition of storage batteries. More specifically, the present invention relates to electronic battery testers which measure a dynamic parameter of batteries.

Electronic battery testers are used to test storage batteries. Various examples of such testers are described in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BAT- TERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY;

U.S. Ser. No. 10/177,635, filed Jun. 21, 2002, entitled BATTERY CHARGER WITH BOOSTER PACK; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/271,342, filed Oct. 15, 2002, entitled IN-VEHICLE BATTERY MONITOR; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE; U.S. Ser. No. 60/437,224, filed Dec. 31, 2002, entitled DISCHARGE VOLTAGE PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388,855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 09/654,217, filed Sep. 1, 2000, entitled SYSTEM AND METHOD FOR PROVIDING STEP-DOWN POWER CONVERSION USING INTELLIGENT SWITCH; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/280,186, filed Oct. 25, 2002, entitled BATTERY TESTER CONFIGURED TO RECEIVE A REMOVABLE DIGITAL MODULE; and U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/767,945, filed Jan. 29, 2004, entitled ELECTRONIC BATTERY TESTER; U.S. Ser. No. 10/783,682, filed Feb. 20, 2004, entitled REPLACEABLE CLAMP FOR ELECTRONIC BATTERY TESTER; U.S. Ser. No. 60/548,513, filed Feb. 27, 2004, entitled WIRELESS BATTERY MONITOR; U.S. Ser. No. 10/791,141, filed Mar. 2, 2004, entitled METHOD AND APPARATUS FOR AUDITING A BATTERY TEST; U.S. Ser. No. 60/557,366, filed Mar. 29, 2004, entitled BATTERY MONITORING SYSTEM WITHOUT CURRENT MEASUREMENT; U.S. Ser. No. 10/823,140, filed Apr. 13, 2004, entitled THEFT PREVENTION DEVICE FOR AUTOMOTIVE VEHICLE SERVICE CENTERS; which are incorporated herein in their entirety.

It is known that the condition of a battery can be provided by comparing a rating of the battery with a measured value. However, other techniques for providing a relative battery test could provide additional information regarding battery condition.

SUMMARY OF THE INVENTION

An electronic battery tester for testing a storage battery provides a relative test output indicative of a condition of the battery as a function of a measured dynamic parameter of the battery and at least one empirical input variable. The tester includes first and second Kelvin connections configured to electrically couple to terminals of the battery. Dynamic parameter measurement circuitry provides a dynamic parameter output related to a dynamic parameter of the battery. Calculation circuitry provides the relative test output as a function of the dynamic parameter and the empirical input variable.

DETAILED DESCRIPTION OF THE PREFERRED EMBODIMENTS

Figure 1:
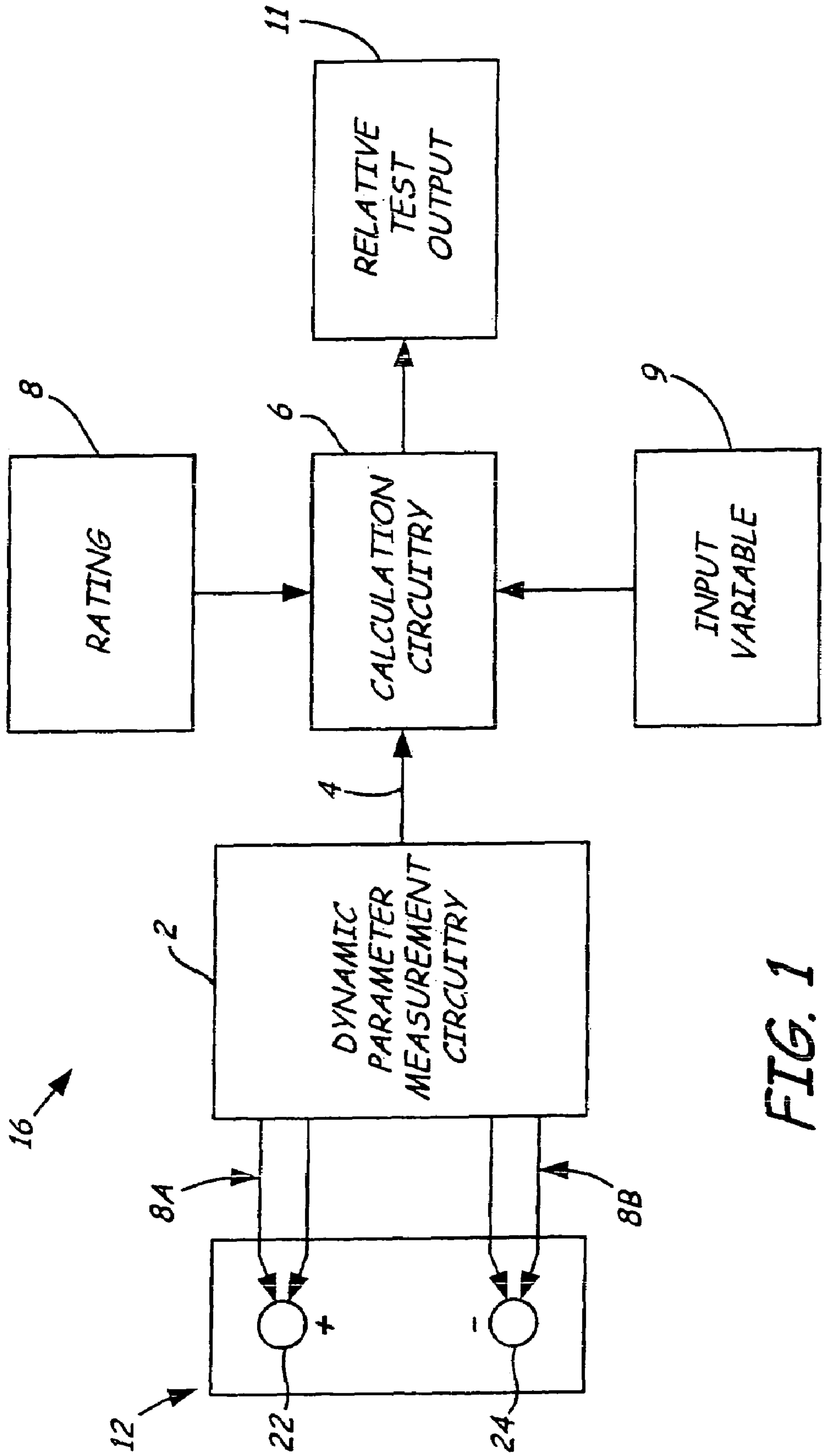
FIG. 1 is a simplified block diagram of an electronic battery tester in accordance with the present invention.

FIG. 1 is a simplified block diagram of electronic battery tester 16 in accordance with the present invention. Apparatus 16 is shown coupled to battery 12 which includes a positive battery terminal 22 and a negative battery terminal 24. Battery 12 is a storage battery having a plurality of individual cells and a voltage such as 12.6 volts, 48 volts, etc.

FIG. 1 operates in accordance with the present invention and includes dynamic parameter measurement circuitry 2 which is configured to measure a dynamic parameter of battery 12 through first and second Kelvin connections 8A and 8B. Dynamic parameter measurement circuitry 2 measures a dynamic parameter, that is a parameter which is a function of a signal with a time varying component, of battery 12 and provides a dynamic parameter output 4 to calculation circuitry 6. Example dynamic parameters include dynamic conductance resistance, reactance, susceptance, and their combinations. Calculation circuitry 6 receives the dynamic parameter output 4 and an optional rating 8 which relates to a rating of battery 12 and an empirical input variable 9. Based upon the optional rating, the empirical input variable and the measured dynamic parameter output 4, calculation circuitry 6 responsively provides a relative test output 11 of battery 12.

In various aspects of the invention, the relative test output can be various relative indications of a battery's condition. For example, in one embodiment, the relative test output is indicative of a time required to charge the battery. In such an embodiment, the possible input variables include the size of the battery and the available charge current. Another example relative test output is the condition of the battery relative to a particular geographic area. In such an embodiment the input variable can comprise geographical information. For example, a battery suitable for use in warm regions, such as the southern United States may not be suitable for use in colder regions such as the northern United States. Further, such geographical information can be used in estimating aging of a battery. A battery in certain climates may age faster than a battery in other climates or areas. Further, a "weak" battery may be suitable for use in some geographical areas but not others. Another example relative test output is a run time output indicative of the time a battery can supply a required power level to a load. In such an embodiment the input variable can be the load size or required power.

Another example relative test output is an end of life output indicative of an estimated remaining life of the battery. In such an embodiment the input variable can comprise certain minimum requirements for a particular battery below which the battery's life will be considered to have ended.

Another relative test output comprises a vehicle size output which is indicative of the size of a vehicle, or a size of an engine of a vehicle, for which the battery can be used. For example, some vehicles or engines may require larger batteries. In such an embodiment, the input variable can comprise information related to vehicle size, vehicle type or engine size.

Another example relative test output comprises a battery condition output which is compensated based upon the age of the battery. In one embodiment, the battery test is tested using more difficult criteria if the battery is new to ensure high deliverable quality. In another example, an older battery may also be tested more severely as an older battery is more likely to be defective. In such an embodiment the input variable can be related to the battery age.

Figure 2:
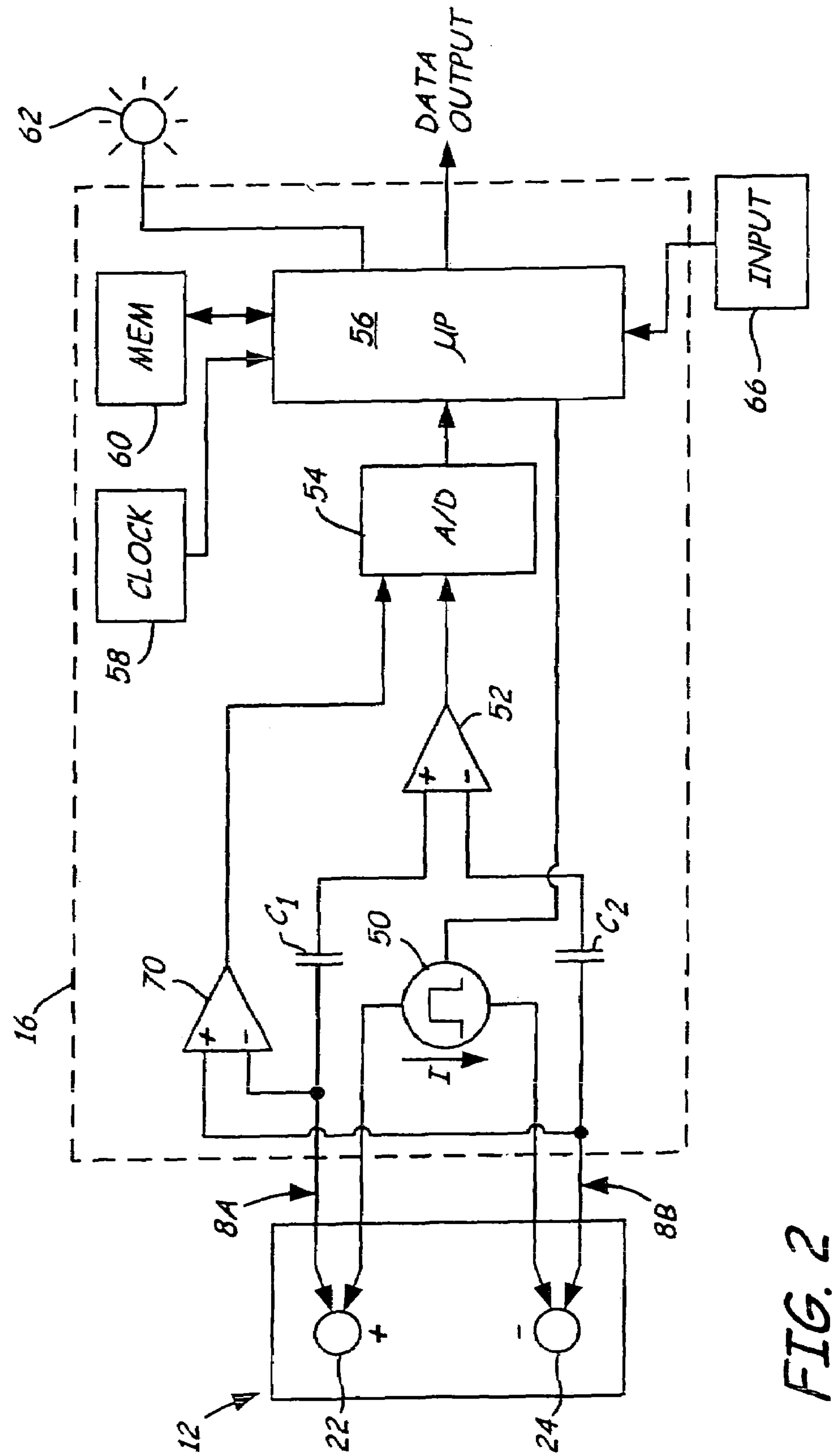
FIG. 2 is a more detailed block diagram of the battery tester of FIG. 1.

FIG. 2 is a more detailed block diagram of circuitry 16 which operates in accordance with one embodiment of the present invention and determines a dynamic parameter such as the conductance ($G_{BAT}$) of battery 12 and the voltage potential ($V_{BAT}$) between terminals 22 and 24 of battery 12. Circuitry 16 includes a forcing function such as current source 50, differential amplifier 52, analog-to-digital converter 54 and microprocessor 56. In this embodiment, dynamic parameter measurement circuitry 2 shown in FIG. 1 generally comprises source 50, amplifier 52, analog to digital converter 54, amplifier 70 and microprocessor 56. Calculation circuitry 6 generally comprises microprocessor 56. The general blocks shown in FIG. 1 can be implemented as desired and are not limited to the configurations shown in FIG. 2. Amplifier 52 is capacitively coupled to battery 12 through capacitors $C_1$ and $C_2$. Amplifier 52 has an output connected to an input of analog-to-digital converter 54. Microprocessor 56 is connected to system clock 58, memory 60, pass/fail indicator 62 and analog-to-digital converter 54. Microprocessor 56 is also capable of receiving an input from input device 66. The input can be the empirical input variable, a rating of the battery, or other data as desired.

In operation, current source 50 is controlled by microprocessor 56 and provides a current in the direction shown by the arrow in FIG. 2. This can be any type of time varying signal. Source 50 can be an active source or a passive source such as a resistance. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 24 and 22, respectively. Amplifier 70 is connected to measure the open circuit potential voltage ($V_{BAT}$) of battery 12 between terminals 22 and 24. The output of amplifier 70 is provided to analog-to-digital converter 54 such that the voltage across terminals 22 and 24 can be measured by microprocessor 56.

Circuitry 16 is connected to battery 12 through a four-point connection technique known as a Kelvin connection. This Kelvin connection allows current I to be injected into battery 12 through a first pair of terminals while the voltage V across the terminals 22 and 24 is measured by a second pair of connections. Because very little current flows through amplifier 52, the voltage drop across the inputs to amplifier 52 is substantially identical to the voltage drop across terminals 22 and 24 of battery 12. The output of differential amplifier 52 is converted to a digital format and is provided to microprocessor 56. Microprocessor 56 operates at a frequency determined by system clock 58 and in accordance with programming instructions stored in memory 60.

Microprocessor 56 determines the conductance of battery 12 by applying a current pulse I using current source 50. This can be, for example, by selectively applying a load such as a resistance. The microprocessor determines the change in battery voltage due to the current pulse I using amplifier 52 and analog-to-digital converter 54. The value of current I generated by current source 50 is known and is stored in memory 60. In one embodiment, current I is obtained by applying a load to battery 12. Microprocessor 56 calculates the conductance of battery 12 using the following equation:

$$\text{Conductance}=G_{BAT}=\Delta I/\Delta V \qquad \text{Equation 1}$$

where ΔI is the change in current flowing through battery 12 due to current source 50 and ΔV is the change in battery voltage due to applied current ΔI.

Microprocessor 56 operates in accordance with the present invention and determines the relative test output discussed herein. The relative test output can be provided on the data output. The data output can be a visual display or other device for providing information to an operator and/or can be an output provided to other circuitry.

Figure 3:
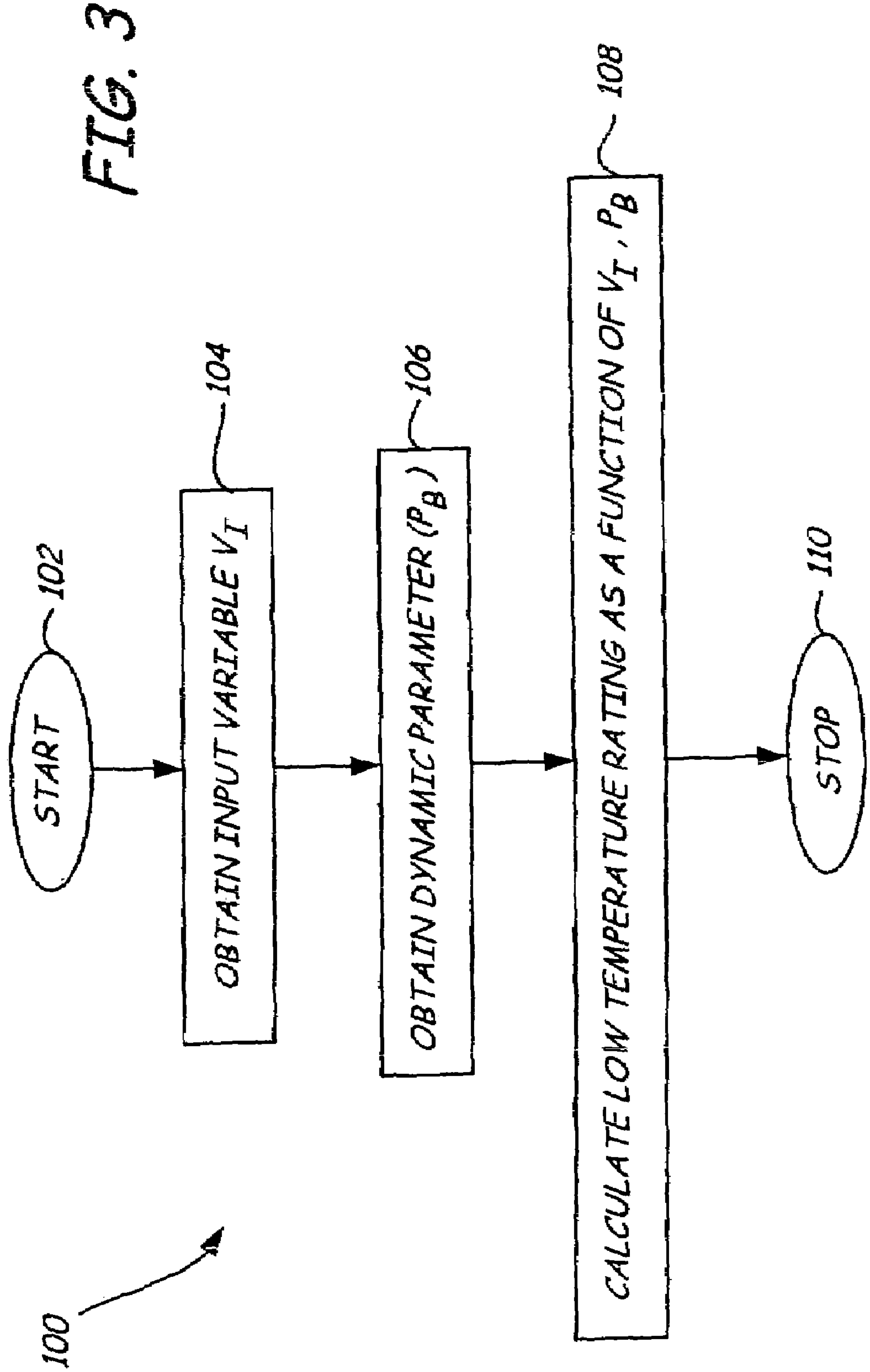
FIG. 3 is a simplified flow chart showing steps in accordance with the present invention.

FIG. 3 is a flow chart 100 showing operation of microprocessor 56 based upon programming instructions stored in memory 60. Block diagram 100 begins at start block 102. At block 104, an empirical input variable $V_I$ is obtained. This can be, for example, retrieved from memory 60 or received from input 66. At block 106, the dynamic parameter $P_B$ is determined. At block 108, the relative test output of the battery is calculated as a function of $V_I$ and $P_B$. Block diagram 100 terminates at stop block 110.

Some prior art battery testers have compared a battery measurement to a fixed value, such as a rating of the battery in order to provide a relative output. For example, by comparing a measured value of the battery with the rating of the battery, an output can be provided which is a percentage based upon a ratio of the measured value to the rated value. However, the present invention recognizes that in some instances it may be desirable to provide an operator with some other type of relative output. With the present invention, a relative test output is provided which is a function of a dynamic parameter measurement of the battery and at least one empirical input variable.

As used herein, a dynamic parameter of the battery is a parameter which has been measured using an applied signal (either passively or actively) with a time varying component. Example dynamic parameters include dynamic resistance, conductance, reactance, susceptance and there combinations both real, imaginary and combinations.

An empirical input variable as used herein refers to variables which are observed, measured or otherwise determined during use of battery and are not static variables such as a rating of the battery which is determined during manufacture of the battery. Example empirical input variables include other test results such as load test results, bounce back load test results, voltage measurements, state of charge measurements from specific gravity, voltage or other measurement techniques; visual observations such as terminal corrosion, cracked case or others conditions; charge acceptance from an alternator; charge acceptance from a source of the battery tester; operator or customer behavior information such as how the vehicle is used; vehicle age or condition; change in conductance (or other dynamic parameter) or change in charge acceptance during charge or discharge; data retrieved from a previous test of the battery; battery weight; geographic information; time required to charge the battery; the time or period over which the battery can power a particular load; the vehicle size or engine size that the battery can operate; the number of engine starts performed by the battery per day; or other similar observations or measurements.

Based upon the measured dynamic parameter and the empirical input variable, a relative test output is provided. Examples of a relative test output include an end of life prediction for the battery which can be in the form of months, seasons or other forms; a predicted number of engine starts of the vehicle which the battery can perform; a predicted number of charge and discharge cycles which the battery is capable of experiencing, a prediction of time to reach an end voltage based upon current draw and temperature; a predicted time to charge the battery based upon charge current and temperature; a prediction of the largest current at which a load test applied to the battery can be passed; a prediction of the reserve capacity of the battery; a prediction of the number of amp-hours remaining in the battery, or others.

The relative test output can be shown on a display, used to provide pass/fail information or passed along the other circuitry.

The present invention may be implemented using any appropriate technique. For simplicity, a single technique has been illustrate herein. However, other techniques may be used including implementation in all analog circuitry. Additionally, by using appropriate techniques, any dynamic parameter can be measured. With the present invention, a desired output level of the battery is obtained, for example through an input.

Although the present invention has been described with reference to preferred embodiments, workers skilled in the art will recognize that changes may be made in form and detail without departing from the spirit and scope of the invention. The specific relationship between the relative test output and the empirical input variable can be determined experimentally or by developing models and relationships which characterize the battery as desired.

What is claimed is:

1. An electronic battery tester for testing a storage battery, comprising:

Kelvin connections configured to couple to terminals of the battery;

measurement circuitry coupled to the Kelvin connections configured to measure a dynamic parameter of the battery and a voltage across terminals of the battery;

an empirical variable input configured to receive an empirical input variable;

computation circuitry configured to provide a relative battery test output as a function of the dynamic parameter and the empirical input variable, the relative test output indicative of a condition of the battery.

2. The apparatus of claim 1 wherein the measurement circuitry is further configured to measure a voltage across terminals of the battery and the relative test output is further a function of a voltage and is indicative of a time to charge the battery.

3. The apparatus of claim 1 wherein the dynamic parameter is measured using a time varying signal.

4. The apparatus of claim 1 wherein the empirical input variable comprises a result of a load test.

5. The apparatus of claim 1 wherein the empirical input variable comprises a result of a bounce back load test.

6. The apparatus of claim 1 wherein the empirical input variable comprises voltage measurements.

7. The apparatus of claim 1 wherein the empirical input variable comprises state of charge measurements.

8. The apparatus of claim 1 wherein the empirical input variable comprises a visual observation.

9. The apparatus of claim 8 wherein the visual observation is related to corrosion of terminals of the battery.

10. The apparatus of claim 8 wherein the visual observation is related to a cracked battery case.

11. The apparatus of claim 1 wherein the empirical input variable is related to acceptance of charge by the battery from an alternator.

12. The apparatus of claim 1 wherein the battery tester includes a charging source and the empirical input variable is indicative of charge acceptance by the battery from the source.

13. The apparatus of claim 1 wherein the empirical input variable is related to operator behavior.

14. The apparatus of claim 1 wherein the empirical input variable is indicative of vehicle age.

15. The apparatus of claim 1 wherein the empirical input variable is indicative of vehicle condition.

16. The apparatus of claim 1 wherein the empirical input variable is indicative of a change in a dynamic parameter of the battery.

17. The apparatus of claim 1 wherein the empirical input variable is indicative of charge acceptance of the battery during charging.

18. The apparatus of claim 1 wherein the empirical input variable is indicative of a previous test of the battery.

19. The apparatus of claim 1 wherein the empirical input variable is indicative of battery weight.

20. The apparatus of claim 1 wherein the empirical input variable is indicative of geographic information.

21. The apparatus of claim 1 wherein the empirical input variable is related to time required to charge the battery.

22. The apparatus of claim 1 wherein the empirical input variable is related to a time period during which the battery can power a particular load.

23. The apparatus of claim 1 wherein the empirical input variable is indicative of a vehicle size or engine size that the battery can operate.

24. The apparatus of claim 1 wherein the empirical input variable is related to the number of engine starts performed by the battery per day.

25. The apparatus of claim 1 wherein the relative test output is indicative of a predicted end of life of the battery.

26. The apparatus of claim 1 wherein the relative test output is indicative of a predicted number of engine starts of the vehicle which the battery can perform.

27. The apparatus of claim 1 wherein the relative test output is indicative of a predicted number of charge and discharge cycles which the battery is capable of experiencing.

28. The apparatus of claim 1 wherein the relative test output comprises a prediction of a time to reach an end voltage.

29. The apparatus of claim 28 wherein the time to reach an end voltage is further a function of current draw and temperature.

30. The apparatus of claim 1 wherein the relative test output comprises a predicted time to charge the battery based upon a charge current and a temperature.

31. The apparatus of claim 1 wherein the relative test output comprises a prediction of a largest current at which a load test applied to the battery can be passed.

32. The apparatus of claim 1 wherein the relative test output comprises a prediction of a reserve capacity of a battery.

33. The apparatus of claim 1 wherein the relative test output comprises a prediction of a number of amp hours remaining in the battery.

34. A method for testing a storage battery comprising:

coupling Kelvin connectors to positive and negative terminals of the battery;

measuring a dynamic parameter of the battery using the Kelvin connectors;

receiving an empirical input variable;

determining a relative test output indicative of a condition of the battery based upon the dynamic parameter in the empirical input variable.

35. The method of claim 34 including measuring a voltage across terminals of the battery and the relative test output is further a function of a voltage and is indicative of a time to charge the battery.

36. The method of claim 34 including applying a time varying signal to the battery and wherein the dynamic parameter is measured using a time varying signal.

37. The method of claim 34 wherein the empirical input variable comprises a result of a load test.

38. The method of claim 34 wherein the empirical input variable comprises a result of a bounce back load test.

39. The method of claim 34 wherein the empirical input variable will comprise voltage measurements.

40. The method of claim 34 wherein the empirical input variable comprises state of charge measurements.

41. The method of claim 34 wherein the empirical input variable comprises a visual observation.

42. The method of claim 41 wherein the visual observation is related to corrosion of terminals of the battery.

43. The method of claim 41 wherein the visual observation is related to a cracked battery case.

44. The method of claim 34 wherein the empirical input variable is related to acceptance of charge by the battery from an alternator.

45. The method of claim 34 including charging the battery and the empirical input variable is indicative of charge acceptance by the battery.

46. The method of claim 34 wherein the empirical input variable is related to operator behavior.

47. The method of claim 34 wherein the empirical input variable is indicative of vehicle age.

48. The method of claim 34 wherein the empirical input variable is indicative of vehicle condition.

49. The method of claim 34 wherein the empirical input variable is indicative of a change in a dynamic parameter of the battery.

50. The method of claim 34 wherein the empirical input variable is indicative of charge acceptance of the battery during charging.

51. The method of claim 34 wherein the empirical input variable is indicative of a previous test of the battery.

52. The method of claim 34 wherein the empirical input variable is indicative of battery weight.

53. The method of claim 34 wherein the empirical input variable is indicative of geographic information.

54. The method of claim 34 wherein the empirical input variable is related to time required to charge the battery.

55. The method of claim 34 wherein the empirical input variable is related to a time period during which the battery can power a particular load.

56. The method of claim 34 wherein the empirical input variable is indicative of a vehicle size or engine size that the battery can operate.

57. The method of claim 34 wherein the empirical input variable is related to the number of engine starts performed by the battery per day.

58. The method of claim 34 wherein the relative test output is indicative of a predicted end of life of the battery.

59. The method of claim 34 wherein the relative test output is indicative of a predicted number of engine starts of the vehicle which the battery can perform.

60. The method of claim 34 wherein the relative test output is indicative of a predicted number of charge and discharge cycles which the battery is capable of experiencing.

61. The method of claim 34 wherein the relative test output comprises a prediction of a time to reach an end voltage.

62. The method of claim 61 wherein the time to reach an end voltage is further a function of current draw and temperature.

63. The method of claim 34 wherein the relative test output comprises a predicted time to charge the battery based upon a charge current and a temperature.

64. The method of claim 34 wherein the relative test output comprises a prediction of a largest current at which a load test applied to the battery can be passed.

65. The method of claim 34 wherein the relative test output comprises a prediction of a reserve capacity of a battery.

66. The method of claim 34 wherein the relative test output comprises a prediction of a number of amp hours remaining in the battery.

67. An electronic battery tester implementing the method of claim 34.

* * * * *